United States Patent
Ozaki et al.

(10) Patent No.: US 9,941,401 B2
(45) Date of Patent: Apr. 10, 2018

(54) SEMICONDUCTOR DEVICE, POWER SUPPLY APPARATUS AND HIGH-FREQUENCY AMPLIFIER

(71) Applicant: FUJITSU LIMITED, Kawasaki-shi, Kanagawa (JP)

(72) Inventors: Shirou Ozaki, Yamato (JP); Kozo Makiyama, Kawasaki (JP); Naoya Okamoto, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/299,455

(22) Filed: Oct. 20, 2016

(65) Prior Publication Data
US 2017/0125569 A1 May 4, 2017

(30) Foreign Application Priority Data

Oct. 29, 2015 (JP) .................... 2015-213150

(51) Int. Cl.
| H01L 29/778 | (2006.01) |
| H01L 21/02 | (2006.01) |
| H01L 21/28 | (2006.01) |
| H01L 29/20 | (2006.01) |
| H01L 29/205 | (2006.01) |
| H01L 29/51 | (2006.01) |

(52) U.S. Cl.
CPC .... *H01L 29/7787* (2013.01); *H01L 21/02172* (2013.01); *H01L 21/02241* (2013.01); *H01L 21/28264* (2013.01); *H01L 29/2003* (2013.01); *H01L 29/205* (2013.01); *H01L 29/517* (2013.01); *H01L 21/02178* (2013.01)

(58) Field of Classification Search
CPC ......... H01L 29/66431; H01L 29/66462; H01L 29/778–29/7789; H01L 2924/13064; H01L 29/122–29/127; H01L 29/15–29/158
See application file for complete search history.

(56) References Cited

U.S. PATENT DOCUMENTS

| 2005/0139870 A1* | 6/2005 | Hikita | H01L 29/7783 257/280 |
| 2009/0057720 A1* | 3/2009 | Kaneko | H01L 29/42316 257/194 |
| 2010/0012977 A1 | 1/2010 | Derluyn et al. | |
| 2013/0102140 A1 | 4/2013 | Derluyn et al. | |
| 2013/0320349 A1 | 12/2013 | Saunier et al. | |

FOREIGN PATENT DOCUMENTS

| JP | 2010-45343 | 2/2010 |
| JP | 2013-251544 | 12/2013 |

\* cited by examiner

*Primary Examiner* — Tucker J Wright
(74) *Attorney, Agent, or Firm* — Fujitsu Patent Center

(57) ABSTRACT

A semiconductor device includes a semiconductor stacked structure in which a semiconductor layer including an electron supply layer and an electron transit layer is stacked, and a gate electrode contacting with the semiconductor layer included in the semiconductor stacked structure or an insulating layer. The portion of the gate electrode contacting with the semiconductor layer or the insulating layer is an oxide of a metal configuring the portion of the gate electrode contacting with the semiconductor layer or the insulating layer.

6 Claims, 15 Drawing Sheets

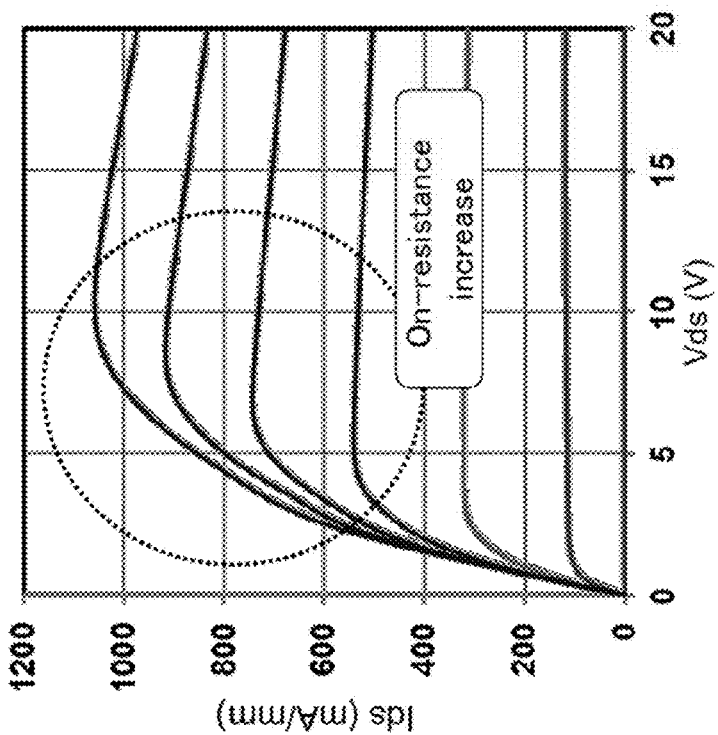
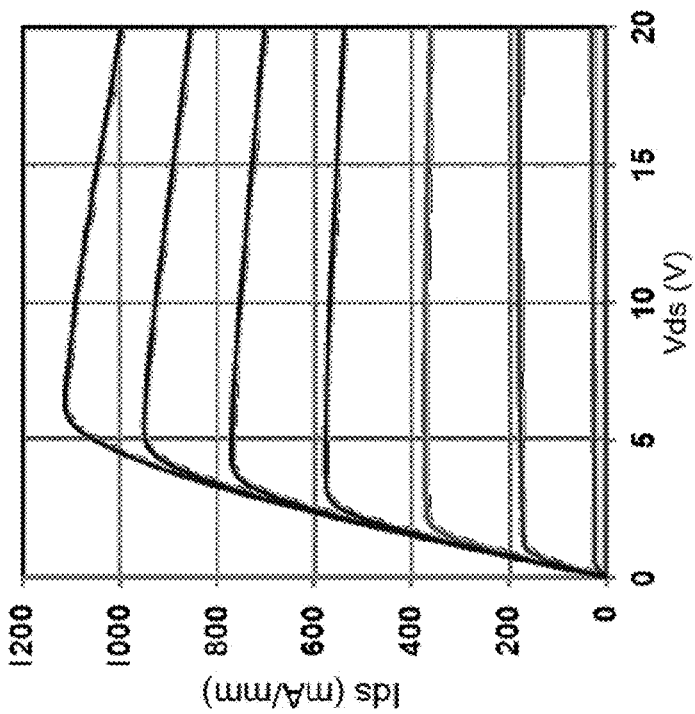
FIG. 3A
FIG. 3B

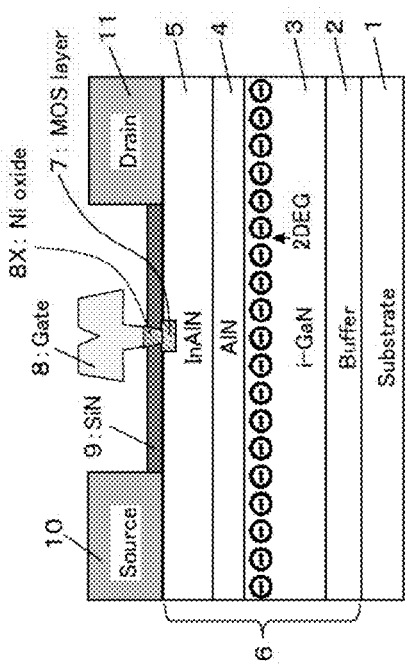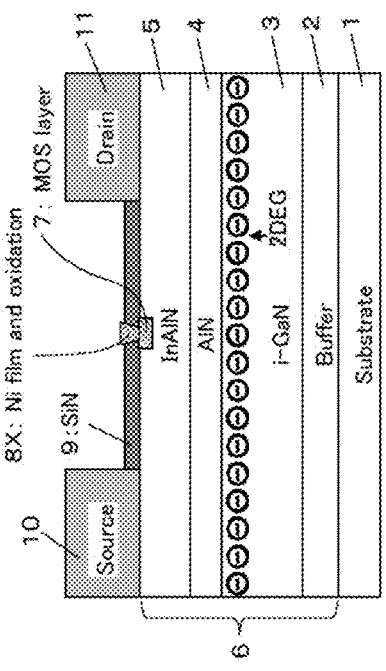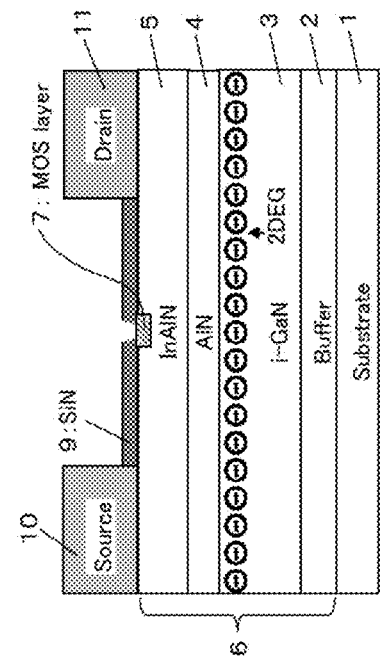

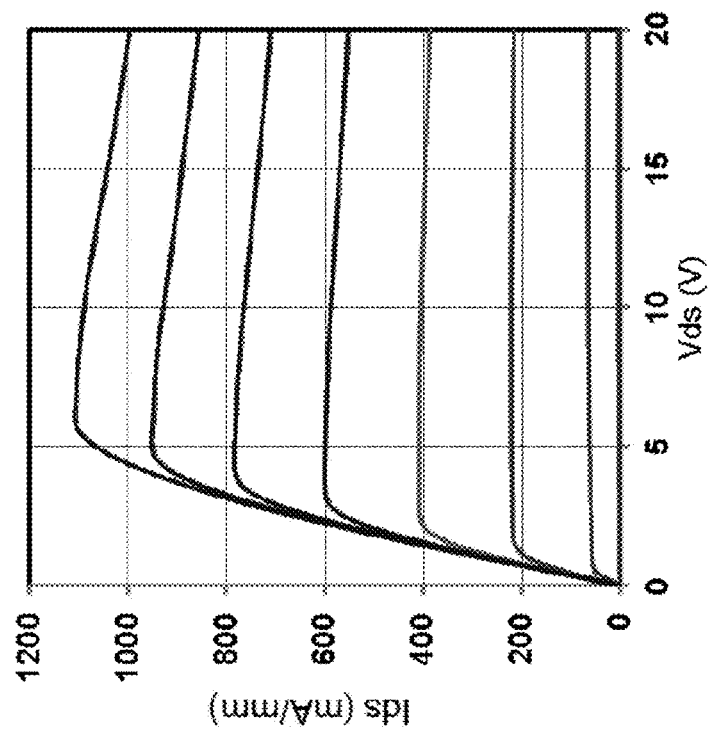
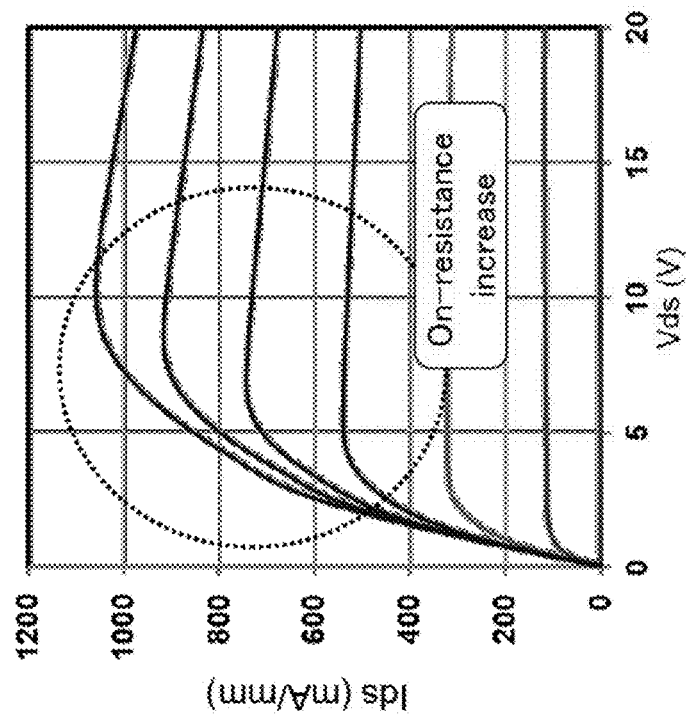

SEMICONDUCTOR DEVICE, POWER SUPPLY APPARATUS AND HIGH-FREQUENCY AMPLIFIER

CROSS-REFERENCE TO RELATED APPLICATION

This application is based upon and claims the benefit of priority of the prior Japanese Patent Application No. 2015-213150, filed on Oct. 29, 2015, the entire contents of which are incorporated herein by reference.

FIELD

The embodiments discussed herein are related to a semiconductor device, a power supply apparatus and a high-frequency amplifier.

BACKGROUND

Conventionally, as a semiconductor device having a semiconductor stacked structure including an electron supply layer and an electron transit layer, a field-effect transistor for which GaN is used such as a high electron mobility transistor (HEMT) for which GaN is used (GaN-HEMT) is available.

As such a GaN-HEMT as just described, an HEMT is available in which AlGaN, InAlN, InAlGaN or the like is used for the electron supply layer and an oxide layer is formed by oxidizing part of the electron supply layer and besides a gate electrode is provided over the oxide layer.

SUMMARY

According to an aspect of the embodiment, a semiconductor device includes a semiconductor stacked structure in which a semiconductor layer including an electron supply layer and an electron transit layer is stacked, and a gate electrode contacting with the semiconductor layer included in the semiconductor stacked structure or an insulating layer, wherein the portion of the gate electrode contacting with the semiconductor layer or the insulating layer is an oxide of a metal configuring the portion of the gate electrode contacting with the semiconductor layer or the insulating layer.

According to an aspect of the embodiment, a power supply apparatus includes a transformer, and a high-voltage circuit and a low-voltage circuit provided sandwiching the transformer therebetween, wherein the high-voltage circuit includes a transistor, the transistor includes a semiconductor stacked structure in which a semiconductor layer including an electron supply layer and an electron transit layer is stacked and a gate electrode contacting with the semiconductor layer included in the semiconductor stacked structure or an insulating layer, and the portion of the gate electrode contacting with the semiconductor layer or the insulating layer is an oxide of a metal configuring the portion of the gate electrode contacting with the semiconductor layer or the insulating layer.

According to an aspect of the embodiment, a high-frequency amplifier includes an amplifier configured to amplify an input signal, wherein the amplifier includes a transistor, and the transistor includes a semiconductor stacked structure in which a semiconductor layer including an electron supply layer and an electron transit layer is stacked and a gate electrode contacting with the semiconductor layer included in the semiconductor stacked structure or an insulating layer, and the portion of the gate electrode contacting with the semiconductor layer or the insulating layer is an oxide of a metal configuring the portion of the gate electrode contacting with the semiconductor layer or the insulating layer.

The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIGS. 3A and 3B are views illustrating a subject that the on-resistance increases after heat treatment in the semiconductor device of the comparative example;

FIGS. 4A to 4C are schematic sectional views illustrating a fabrication method for a semiconductor device according to the first embodiment;

FIGS. 6A, 6B and 7A, 7B are views illustrating effects by the semiconductor device according to the first embodiment;

DESCRIPTION OF EMBODIMENTS

Incidentally, in such a GaN-HEMT as described above, it is demanded to reduce gate leak current.

In this case, for example, it seems promising to form an oxide layer (insulating layer) by oxidizing part of an electron supply layer and provide a gate electrode over the oxide layer as described above.

However, a problem has been found that, by a thermal history of heat treatment (annealing process) or a wiring process after the gate electrode is formed, the oxygen is extracted from the oxide layer provided under the gate electrode to the gate electrode to deteriorate the insulation characteristic, and therefore, gate leak current cannot be reduced sufficiently.

It is to be noted that, while the foregoing is described as a subject where part of the electron supply layer is oxidized to provide the oxide layer, there is a similar subject also in the case where, for example, a gate insulating layer formed from an oxide is provided under the gate electrode. Further, in the case where such an oxide layer or a gate insulating layer is not provided, there is a subject that it is difficult to reduce gate leak current.

Therefore, it is desired to reduce gate leak current with certainty.

In the following, a semiconductor device, a power supply apparatus and a high-frequency amplifier according to the present embodiments are described with reference to the drawings.

First Embodiment

First, a semiconductor device according to the first embodiment is described with reference to FIGS. 1 to 13.

A semiconductor device according to the present embodiment is a semiconductor device having a nitride semiconductor stacked structure for which, for example, a nitride semiconductor is used.

In the description of the present embodiment, the semiconductor device is described taking, as an example, an FET for which a nitride semiconductor is used, particularly, a metal oxide semiconductor (MOS) type InAlN/GaN-HEMT that includes a semiconductor stacked structure (HEMT structure) in which GaN and InAlN are used for an electron transit layer and an electron supply layer, respectively, and includes an oxide layer under a gate electrode.

It is to be noted that the InAlN/GaN-HEMT is sometimes referred to also as InAlN/GaN-FET. Further, the semiconductor stacked structure is sometimes referred to also as III-V group semiconductor stacked structure, GaN-based semiconductor stacked structure, nitride semiconductor stacked structure or compound semiconductor stacked structure. Further, a semiconductor device is sometimes referred to also as III-V group semiconductor device, GaN-based semiconductor device, nitride semiconductor device or compound semiconductor device.

Figure 1:
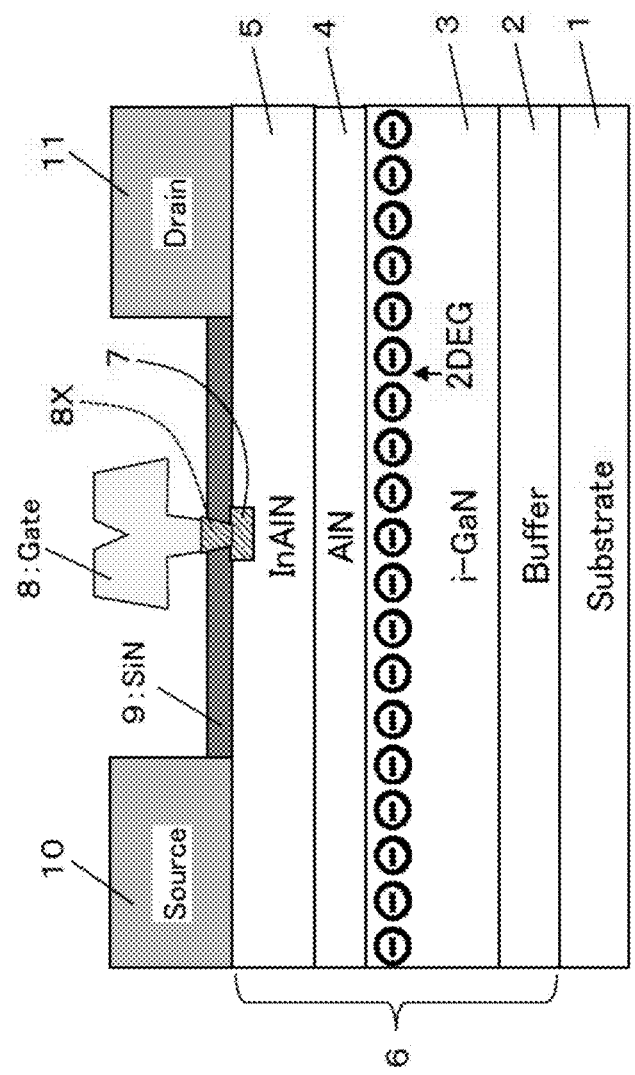
FIG. 1 is a schematic sectional view depicting a configuration of a semiconductor device according to a first embodiment.
Figure 2:
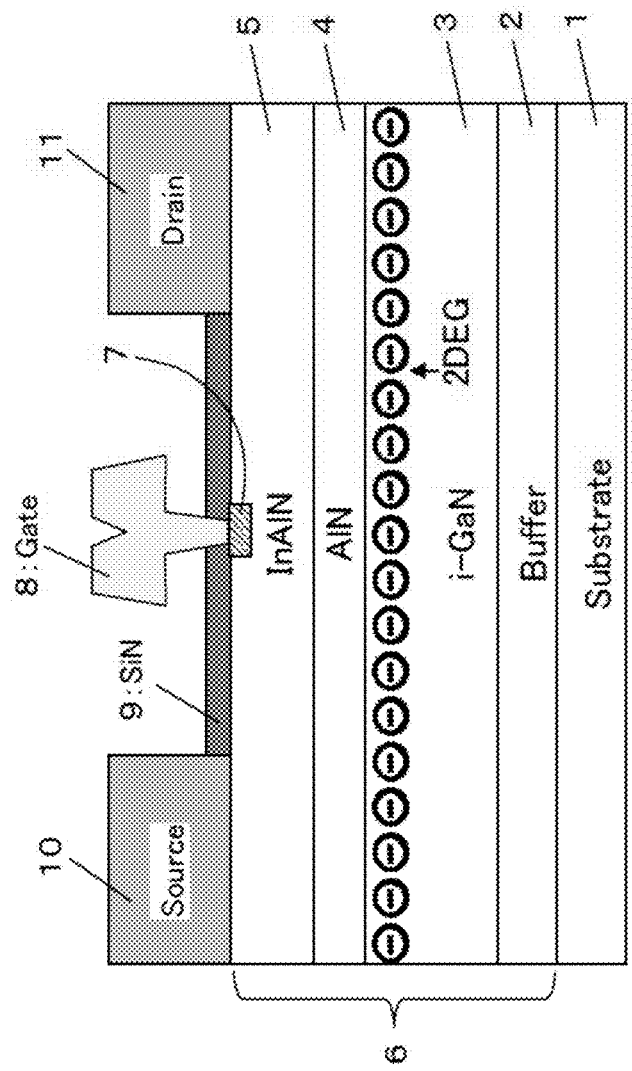
FIG. 2 is a schematic sectional view depicting a configuration of a semiconductor device according to a comparative example.

As depicted in FIG. 1, the present MOS type InAlN/GaN-HEMT includes a semiconductor stacked structure 6 in which a buffer layer 2, a GaN electron transit layer 3, an AlN spacer layer 4 and an InAlN electron supply layer 5 are stacked on an SiC substrate 1. In this case, two-dimensional electron gas (2DEG) is generated in the proximity of the interface between the electron transit layer 3 and the spacer layer 4.

It is to be noted that the SiC substrate 1 is sometimes referred to also as substrate or semiconductor substrate. Further, the buffer layer 2 may be provided as occasion demands. Further, each of the semiconductor layers 3 to 5 is sometimes referred to also as III-V group semiconductor layer, nitride semiconductor layer or compound semiconductor layer.

Further, in the present embodiment, the semiconductor device includes an oxide layer (insulating layer) 7 formed by oxidizing part of the electron supply layer 5, and a gate electrode 8 provided over the oxide layer 7. In particular, the gate electrode 8 contacts with the oxide layer (insulating layer) 7 formed by oxidizing part of the electron supply layer 5 included in the semiconductor stacked structure 6. It is to be noted that the oxide layer 7 is sometimes referred to also as MOS layer. Here, since the electron supply layer 5 is an InAlN electron supply layer, the oxide layer 7 is an oxide layer formed by oxidizing part of the InAlN electron supply layer 5. In this case, preferably the oxide layer 7 is an aluminum oxide layer. In other words, preferably a main component of the oxide layer 7 is an aluminum oxide. Consequently, gate leak current can be suppressed further.

Further, in the present embodiment, an insulating layer (here, SiN film) 9 as a passivation film is provided on the semiconductor stacked structure 6 so as to cover the overall surface.

Further, in the present embodiment, a source electrode 10 and a drain electrode 11 are provided in a spaced relationship from each other across the gate electrode 8, that is, on the opposite sides of the gate electrode 8. The source electrode 10 and the drain electrode 11 contact with the electron supply layer 5. In particular, the source electrode 10 and the drain electrode 11 are provided on the semiconductor stacked structure 6, namely, on the electron supply layer 5 configuring the semiconductor stacked structure 6.

Particularly, in the present embodiment, a portion 8X of the gate electrode 8 contacting with the oxide layer 7 is a metal oxide of a metal configuring the portion of the gate electrode 8 contacting with the oxide layer 7. Here, the metal configuring the portion 8X of the gate electrode 8 contacting with the oxide layer 7 is nickel. In particular, the gate electrode 8 is structured such that Ni and Au are stacked and the portion 8X thereof contacting with the oxide layer 7 is an oxide of Ni (NiO). The portion 8X of the gate electrode 8 contacting with the oxide layer 7 is configured such that the thickness thereof, namely, the thickness of the metal oxide, is approximately 3 nm or more or the O/Ni ratio is 1 or more (namely, the ratio of oxygen is higher than that of the metal). This is because the metal oxide of the portion 8X of the gate electrode 8 contacting with the oxide layer 7 is not a natural oxide film but an intentionally oxidized metal oxide.

Incidentally, the reason why such a configuration as described above is applied is described below.

It is investigated to use, for example, in an ultra high-frequency device for which a GaN-HEMT is used, in order to implement high output power of the device, an InAlN electron supply layer having high spontaneous polarization in place of an AlGaN electron supply layer. Since the InAlN electron supply layer having high spontaneous polarization can induce two-dimensional electron gas of a high concentration even if it is a thin film, it is noticed as a material having both of a high output characteristic and a high frequency characteristic.

However, since the electric field intensity in the inside of the InAlN electron supply layer in the form of a thin film is enhanced by high spontaneous polarization, gate leak current increases particularly in an HEMT having a Schottky gate electrode. The high gate leak current not only blocks high-output and high-efficiency operation of the device but also is directly connected to degradation of the reliability of the device.

Therefore, it is investigated to form a MOS structure by oxidizing part of the outermost surface of the InAlN electron supply layer. In particular, in order to reduce gate leak current, it is investigated to form the oxide layer (insulating layer) 7 by oxidizing part of the InAlN electron supply layer 5 and provide the gate electrode 8 over the oxide layer 7, namely, to provide the oxide layer (MOS layer) 7 between the InAlN electron supply layer 5 and the gate electrode 8 (for example, refer to FIG. 2).

However, when trial production of a prototype was progressed to form an InAlN/GaN-HEMT into an MMIC, it was found that oxygen is extracted from the oxide layer 7 provided under the gate electrode 8 to the gate electrode 8, for example, by heat treatment, a heat history of an interconnection step and so forth, after the gate electrode 8 is formed (gettering). Further, it was found that the insulation of the oxide layer 7 is deteriorated by the gettering of oxygen and the gate leak current cannot be sufficiently reduced.

Therefore, by configuring the portion 8X of the gate electrode 8 contacting with the oxide layer 7 from an oxide of the metal configuring the portion of the gate electrode 8 contacting with the oxide layer 7 as described above, gettering of oxygen, for example, by heat treatment, a heat history or the like can be suppressed to reduce the gate leak current sufficiently and with certainty. Consequently, the output characteristic can be improved while the gate leak current of an InAlN/GaN-HEMT by which a high current concentration can be implemented is reduced sufficiently and with certainty.

Here, where the portion 8X of the gate electrode 8 contacting with the oxide layer 7 is configured from an oxide of the metal configuring the portion of the gate electrode 8 contacting with the oxide layer 7 as described above, the metal oxide (here, NiO) is stable. Therefore, such a situation hardly occurs that oxygen is extracted from the metal oxide (here, NiO) to metal (here, Ni, Au) configuring the gate electrode 8, for example, by heat treatment, a heat history or the like, and the gate leak current can be sufficiently reduced with certainty. On the other hand, even if an oxide (for example, a gate insulating layer and so forth) different from an oxide of the metal configuring the gate electrode 8 is provided, since oxygen is extracted from the oxide or the oxide layer 7 to the gate electrode 8, the gate leak current cannot be sufficiently reduced.

Further, by configuring the portion of the gate electrode 8 contacting with the oxide layer 7 from an oxide of the metal configuring the portion of the gate electrode 8 contacting with the oxide layer 7 as described above, the metal (for example, Ni) configuring the gate electrode 8 can be suppressed from being diffused to the InAlN electron supply layer 5. Also an interfacial reaction can be suppressed.

Especially, if the metal (for example, Ni) configuring the gate electrode 8 is diffused to the InAlN electron supply layer 5, for example, by heat treatment, a heat history or the like, then the channel resistance of the InAlN electron supply layer 5 just under the gate electrode 8 increases and the on-resistance increases as depicted in FIGS. 3A and 3B. It is to be noted that FIG. 3A illustrates an Ids-Vds characteristic before heat treatment and FIG. 3B illustrates an Ids-Vds characteristic after heat treatment (here, 350° C.). In contrast, by configuring the portion of the gate electrode 8 contacting with the oxide layer 7 from an oxide of the metal configuring the portion of the gate electrode 8 contacting with the oxide layer 7 as described above, the metal (for example, Ni) configuring the gate electrode 8 can be suppressed from being diffused to the InAlN electron supply layer 5. Therefore, increase of the on-resistance can be suppressed.

Now, a fabrication method for a semiconductor device (MOS type InAlN/GaN-HEMT) according to the present embodiment is described.

First, a semiconductor stacked structure 6 is formed by stacking a buffer layer 2, a GaN electron transit layer (here, i-GaN electron transit layer) 3, an AlN spacer layer 4 and an InAlN electron supply layer 5 in order on an SiC substrate 1, for example, by a metal organic vapor phase epitaxy (MOVPE) method (refer to FIG. 4A). It is to be noted that a molecular beam epitaxy (MBE) method or the like may be used in place of the MOVPE method.

Then, though not depicted, inter-element isolation is performed, for example, by ion implantation of Ar.

Then, for example, by a photolithography technology, in order to define a source electrode region and a drain electrode region (ohmic electrode regions), a resist film (not depicted) having openings in a source electrode formation region and a drain electrode formation region is provided on the semiconductor stacked structure 6.

Then, a source electrode 10 and a drain electrode 11 are formed on the InAlN electron supply layer 5 using the resist film (refer to FIG. 4A).

In particular, for example, by a photolithography technology, a resist film having openings in the source electrode formation region and the drain electrode formation region is provided and Ti/Al is deposited on the overall area, and then the Ti/Al deposited on the resist film is removed together with the resist film (liftoff method). In this manner, the source electrode 10 and drain electrode 11 formed from Ti/Al are formed on the InAlN electron supply layer 5 in the source electrode formation region and the drain electrode formation region.

Thereafter, heat treatment is performed at a temperature of approximately 400° C. to approximately 1000° C., for example, in a nitrogen atmosphere to establish an ohmic characteristic.

Then, an insulating film 9 as a passivation film for protecting the surface of the InAlN electron supply layer 5 is formed (refer to FIG. 4A). In particular, silicon nitride (SiN) is deposited to a thickness of, for example, approximately 10 to approximately 100 nm by a plasma CVD method to form an SiN film 9 on the surface of the InAlN electron supply layer 5.

Then, for example, by a photolithography technology, a resist film having an opening in a gate electrode formation region is provided, and the insulating film 9 in the gate electrode formation region is removed, for example, by dry etching using fluorine-based gas to form a through-hole in the insulating film 9 (refer to FIG. 4A).

Then, heat treatment is performed at a temperature of approximately 100° C. to approximately 800° C., for example, in a steam atmosphere to oxidize part of the InAlN electron supply layer 5 whose surface is exposed to the bottom face of the through-hole formed in the insulating film 9 and thereby to form an oxide layer (MOS layer) 7 at part of the InAlN electron supply layer 5 under the gate electrode formation region.

Then, a gate electrode 8 is formed on the oxide layer 7 formed at part of the InAlN electron supply layer 5 in the gate electrode formation region by one of first to third methods described below such that the through-hole formed in the insulating film 9 is filled up (refer to FIGS. 4B and 4C).

First, the first method is a technique of performing oxidization of Ni and formation of the gate electrode 8 at the same time by single-time patterning.

In particular, in the first method, for example, by a photolithography technology, in order to define a gate electrode region, a resist film (not depicted) having an opening in the gate electrode formation region is provided on the insulating film 9 and Ni (for example, a thickness of approximately 3 nm) is deposited in the overall area, and then an oxide (NiO) 8X of Ni is formed by performing an oxidization process, for example, by oxygen plasma (refer to FIG. 4B). Then, after Ni (for example, a thickness of approximately 100 nm) and Au are deposited in order on the overall area, the Ni and Au deposited on the resist film are removed together with the resist film (liftoff method). In this manner, the gate electrode 8 that is structured such that Ni and Au are stacked and in which the portion thereof contacting with the oxide layer 7 is the oxide (NiO) 8X of Ni is formed so as to fill up the through-hole formed in the insulating film 9. In this case, the metal configuring the portion 8X of the gate electrode 8 contacting with the oxide layer 7 is nickel (Ni) and the portion 8X of the gate electrode 8 contacting with the oxide layer 7 is an oxide (NiO) of Ni that is the metal configuring the portion of the gate electrode 8 contacting with the oxide layer 7. Further, since the oxide (NiO) 8X of Ni is oxidized intentionally, the oxide 8X is oxidized generally uniformly, different from a natural oxide film.

The second method is a technique for performing film formation of NiO and formation of the gate electrode 8 at the same time by single-time patterning.

In particular, in the second method, for example, using a photolithography technology, in order to define a gate electrode region, a resist film (not depicted) having an opening in the gate electrode formation region is first provided on an insulating film 9, and nickel oxide (NiO; for example, a thickness of approximately 3 nm), Ni (for example, a thickness of approximately 100 nm) and Au are deposited in order on the overall area and then the NiO, Ni and Au deposited on the resist film are removed together with the resist film (liftoff method). In this manner, a gate electrode 8 that is structured such that Ni and Au are stacked and in which a portion 8X thereof contacting with the oxide layer 7 is formed from an oxide (NiO) of Ni is formed so as to fill up the through-hole formed in the insulating film 9 (refer to FIG. 4B). In this case, the metal configuring the portion 8X of the gate electrode 8 contacting with the oxide layer 7 is nickel (Ni) and the portion 8X of the gate electrode 8 contacting with the oxide layer 7 is an oxide (NiO) of Ni that is the metal configuring the portion of the gate electrode 8 contacting with the oxide layer 7. Further, since the oxide (NiO) 8X of Ni is oxidized intentionally, the oxide 8X is oxidized generally uniformly, different from a natural oxide film.

The third method is a technique for performing oxidization of Ni and formation of the gate electrode 8 by patterning separately by two times.

In particular, in the third method, for example, using a photolithography technology, in order to define a gate electrode region, a resist film (not depicted) having an opening in the gate electrode formation region is first provided on an insulating film 9, and Ni (for example, a thickness of approximately 3 nm) is deposited on the overall face and then a single Ni layer to be used as the portion 8X of the gate electrode 8 contacting with the oxide layer 7 is formed by a liftoff method (refer to FIG. 4C). Then, heat treatment is performed at a temperature of approximately 100° C. to approximately 800° C., for example, in a steam atmosphere to oxidize the Ni layer to form an oxide (NiO) layer 8X of Ni (refer to FIG. 4C). Then, though not depicted, a new resist film having an opening in the gate electrode formation region is provided, and Ni (for example, a thickness of approximately 100 nm) and Au are deposited in order on the overall face, whereafter the Ni and Au deposited on the resist film are removed together with the resist film (liftoff method). In this manner, the gate electrode 8 that is structured such that Ni and Au are stacked and in which the portion 8X contacting with the oxide layer 7 is an oxide (NiO) of Ni is formed so as to fill up the through-hole formed in the insulating layer 9. In this case, the metal configuring the portion 8X of the gate electrode 8 contacting with the oxide layer 7 is nickel (Ni), and the portion 8X of the gate electrode 8 contacting with the oxide layer 7 is an oxide (NiO) of Ni of the metal configuring the portion of the gate electrode 8 contacting with the oxide layer 7. Further, since the oxide (NiO) 8X of Ni is oxidized intentionally, the oxide 8X is oxidized generally uniformly, different from a natural oxide film.

The semiconductor device (MOS type InAlN/GaN-HEMT) according to the present embodiment is completed in this manner.

Accordingly, with the semiconductor device according to the present embodiment, there is an advantage that gate leak current can be reduced with certainty.

Actually, the semiconductor device (MOS type InAlN/GaN-HEMT) according to the present embodiment and the semiconductor device (MOS type InAlN/GaN-HEMT; refer to FIG. 2) of the comparative example in which the portion of the gate electrode contacting with the oxide layer is not a metal oxide were produced. Then, the semiconductor devices were compared with each other in the oxygen residual rate of the oxide layer (MOS layer) after heat treatment at a temperature of approximately 350° C. and the $I_{ds}$-$V_{ds}$ characteristic. Thus, such results as depicted in FIGS. 5, 6A and 6B were obtained.

Figure 5:
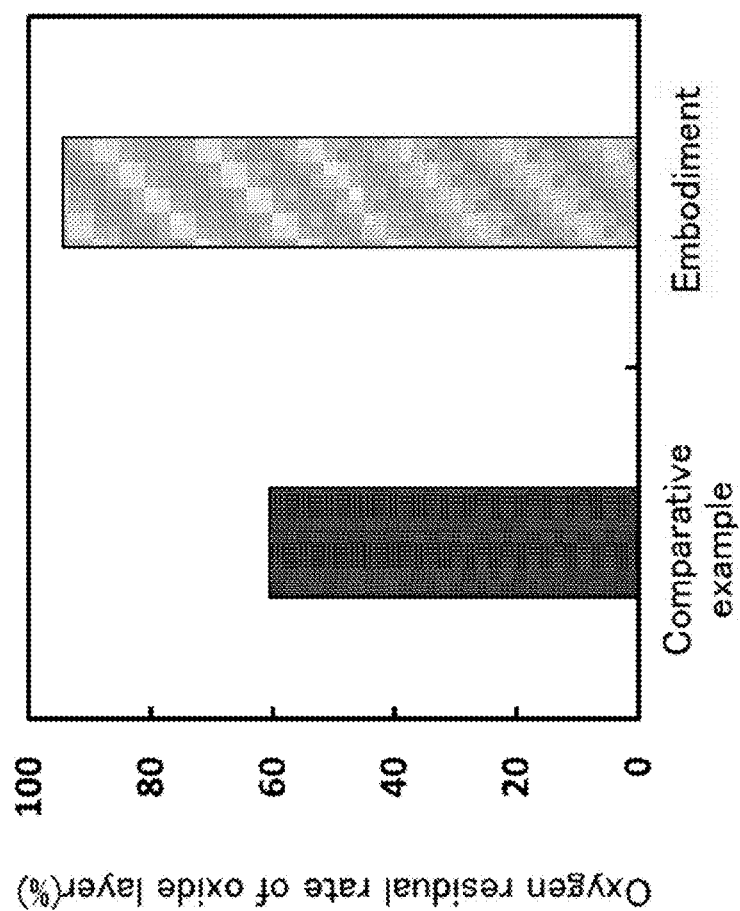
FIG. 5 is a view illustrating an effect by the semiconductor device according to the first embodiment.

First, as depicted in FIG. 5, in the semiconductor device (refer to FIG. 2) of the comparative example, after heat treatment at a temperature of approximately 350° C., oxygen of the oxide layer 7 decreased by approximately 40% and the oxygen residual rate of the oxide layer 7 was approximately 60%. In contrast, in the semiconductor device (refer to FIG. 1) according to the present embodiment, after heat treatment at the temperature of approximately 350° C., decrease of oxygen in the oxide layer 7 was successfully suppressed to approximately 10% or less and the oxygen residual rate of the oxide layer 7 was successfully raised to approximately 90% or more.

In this manner, by configuring the portion 8X of the gate electrode 8 contacting with the oxide layer 7 from a metal oxide as in the semiconductor device according to the present embodiment, the oxygen residual rate of the oxide layer 7 became higher than that of the semiconductor device of the comparative example and oxygen gettering was suppressed and the heat resistance of the oxide layer 7 was improved successfully.

Figure 6A:
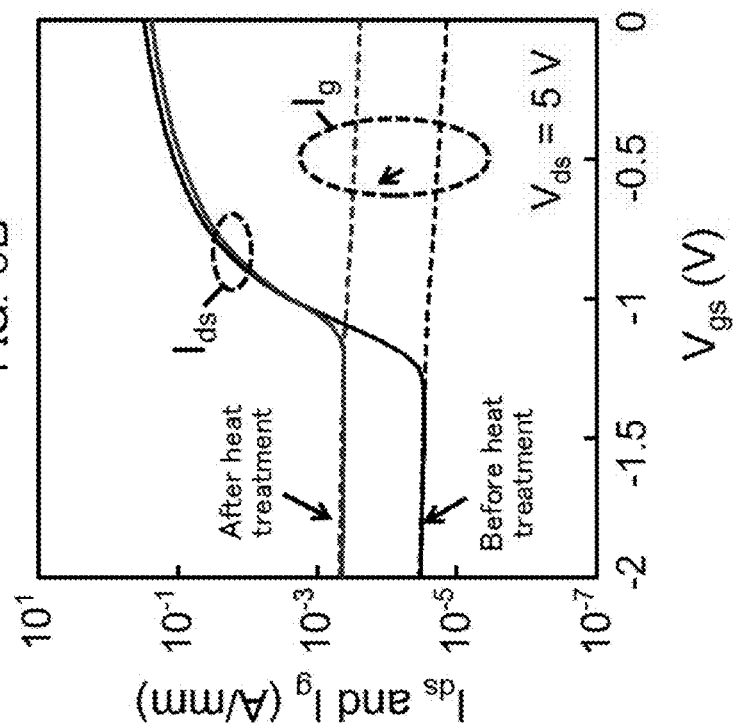
Figure 6B:
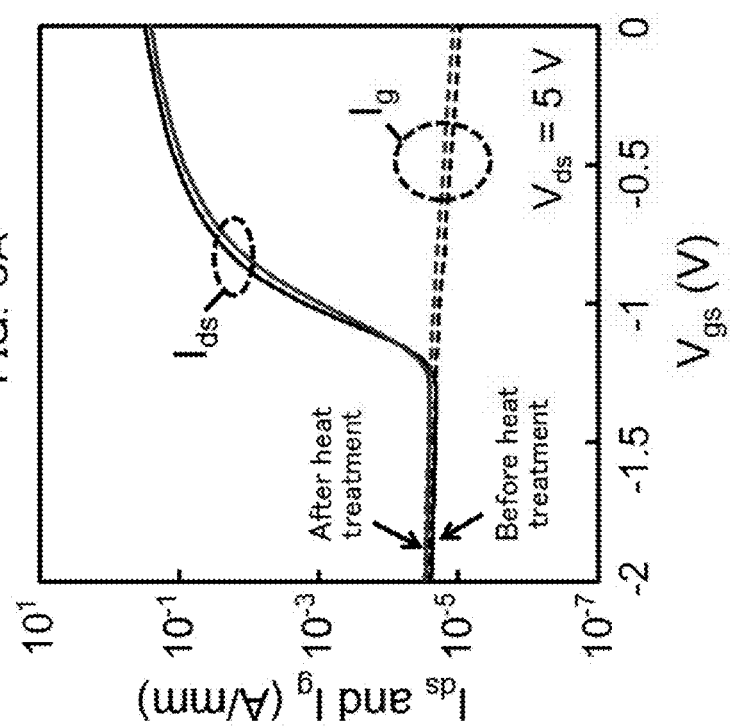

Here, FIG. 6A is a view depicting an $I_{ds}$-$V_{gs}$ characteristic and an $I_g$-$V_{gs}$ characteristic before and after heat treatment of the semiconductor device (refer to FIG. 1) according to the embodiment described above. Meanwhile, FIG. 6B is a view depicting an $I_{ds}$-$V_{gs}$ characteristic and an $I_g$-$V_{gs}$ characteristic before and after heat treatment of the semiconductor device (refer to FIG. 2) of the comparative example. It is to be noted here that the temperature of the heat treatment is approximately 350° C.

While, in the semiconductor device of the comparative example, gate leak current $I_g$ increases after heat treatment as depicted in FIG. 6B, in the semiconductor device according to the present embodiment, as depicted in FIG. 6A, a significant difference is not found in the gate leak current $I_g$ before and after heat treatment and the gate leak current $I_g$ maintains a low level of approximately $3 \times 10^{-5}$ (A/mm) also after heat treatment.

In this manner, by configuring the portion of the gate electrode 8 contacting with the oxide layer 7 from a metal oxide as in the semiconductor device according to the present embodiment, oxygen gettering was suppressed successfully and, by stabilizing the insulation characteristic of the oxide layer 7, the gate leak current was reduced successfully with certainty.

Further, in the semiconductor device (refer to FIG. 2) of the comparative example, the on-resistance increased after heat treatment as indicated by the $I_{ds}$-$V_{ds}$ characteristic after heat treatment at the temperature of approximately 350° C. of FIG. 7A. In contrast, in the semiconductor device (refer to FIG. 1) according to the present embodiment, increase of the on-resistance after heat treatment was suppressed successfully as indicated by the $I_{ds}$-$V_{ds}$ characteristic after heat treatment at the temperature of approximately 350° C. of FIG. 7B.

In this manner, by configuring the portion of the gate electrode 8 contacting with the oxide layer 7 from a metal oxide as in the semiconductor device according to the present embodiment, it is possible to suppress diffusing of metal (for example, Ni) configuring the gate electrode 8 to the InAlN electron supply layer 5 and suppress increase of the on-resistance after heat treatment.

It is to be noted that, while the present embodiment is described taking, as an example, the case where the present technology is applied to a MOS type semiconductor device (MOS type InAlN/GaN-HEMT), the configuration of the semiconductor device is not limited to this. In particular, while, in the MOS type semiconductor device that includes the gate electrode 8 contacting with the oxide layer (insulating layer) 7 obtained by oxidizing part of the electron supply layer 5 included in the semiconductor stacked structure 6, the portion 8X of the gate electrode 8 contacting with the oxide layer (insulating layer) 7 is configured from an oxide of the metal configuring the portion of the gate electrode 8 contacting with the oxide layer (insulating layer) 7, the configuration of the semiconductor device is not limited to this.

As exemplified below, the present technology can be applied to a semiconductor device that includes a semiconductor stacked structure in which a semiconductor layer including an electron supply layer and an electron transit layer is stacked and a gate electrode contacting with the semiconductor layer included in the semiconductor stacked structure or an insulating layer. In particular, in a semiconductor device that includes a semiconductor stacked structure in which a semiconductor layer including an electron supply layer and an electron transit layer is stacked and a gate electrode contacting with the semiconductor layer included in the semiconductor stacked structure or an insulating layer, a portion of the gate electrode contacting with the semiconductor layer or the insulating layer may be configured from an oxide of a metal configuring the portion of the gate electrode contacting with the semiconductor layer or the insulating layer. Here, the metal configuring the portion of the gate electrode contacting with the semiconductor layer or the insulating layer is nickel.

First, the present technology can be applied to a Schottky type semiconductor device (InAlN/GaN-HEMT) including a gate electrode contacting with an electron supply layer that does not have an oxide layer.

Figure 8:
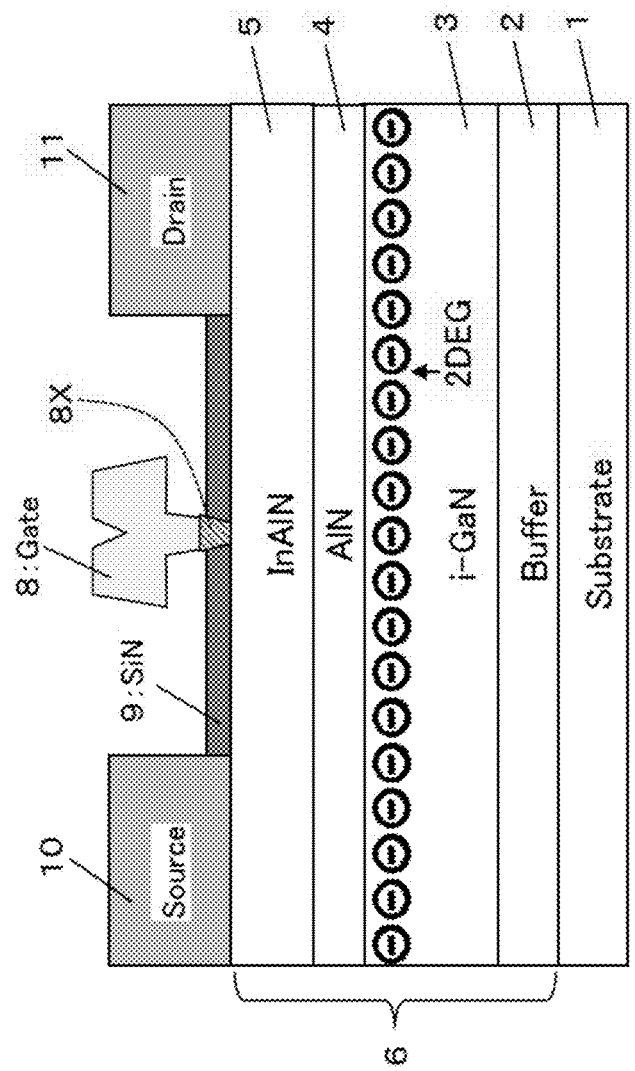
FIGS. 8 to 13 are schematic sectional views individually depicting a configuration of semiconductor devices according to different modifications to the first embodiment.

In particular, for example, as depicted in FIG. 8, in the Schottky type semiconductor device (InAlN/GaN-HEMT) including the gate electrode 8 contacting with the electron supply layer 5 as a semiconductor layer included in the semiconductor stacked structure 6, the portion 8X of the gate electrode 8 contacting with the electron supply layer (semiconductor layer) 5 may be configured from an oxide of the metal configuring the portion of the gate electrode 8 contacting with the electron supply layer (semiconductor layer) 5. Consequently, it is possible to reduce the gate leak current and suppress diffusing of the metal (for example, Ni) configuring the gate electrode 8 to the InAlN electron supply layer 5. Further, it is possible to suppress an interfacial reaction and also suppress increase of the on-resistance.

Further, for example, the present technology can be applied also to a semiconductor device (InAlN/GaN-HEMT) having a semiconductor stacked structure including a cap layer (for example, a GaN layer, an AlN layer or the like) as the semiconductor layer.

Figure 9:
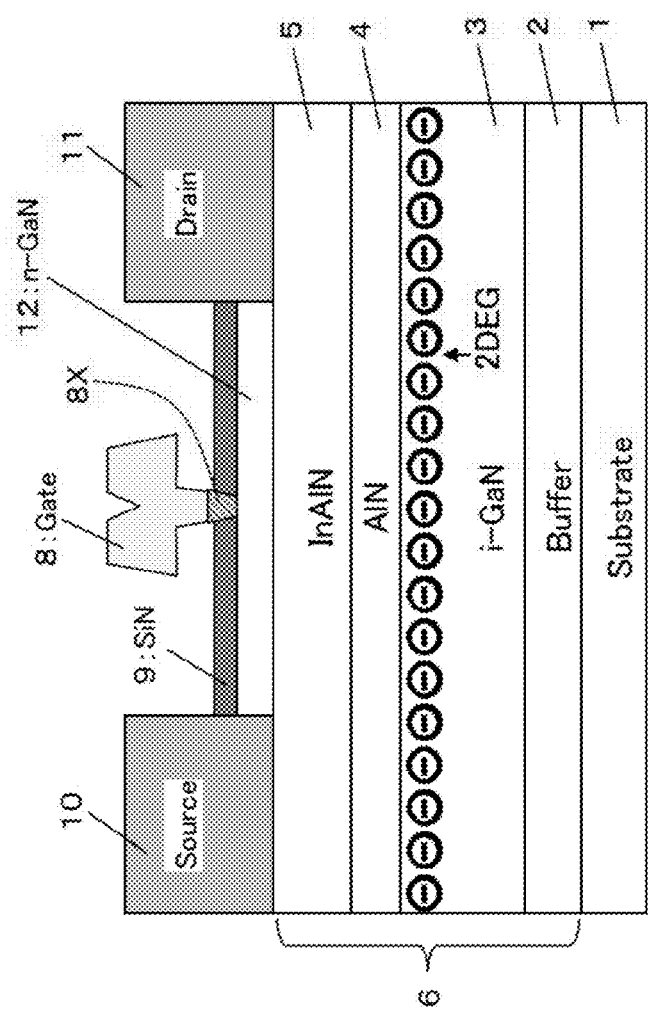

In particular, for example, as depicted in FIG. 9, in the Schottky type semiconductor device (InAlN/GaN-HEMT) that includes the gate electrode 8 contacting with a cap layer 12 (here, n-GaN cap layer) as a semiconductor layer included in the semiconductor stacked structure 6, the portion 8X of the gate electrode 8 contacting with the cap layer (semiconductor layer) 12 may be configured from an oxide of the metal configuring the portion of the gate electrode 8 contacting with the cap layer (semiconductor layer) 12. Consequently, it is possible to reduce the gate leak current and suppress diffusing of the metal (for example, Ni) configuring the gate electrode 8 to the cap layer 12 or the InAlN electron supply layer 5. Further, it is possible to suppress an interfacial reaction and also suppress increase of the on-resistance.

Figure 10:
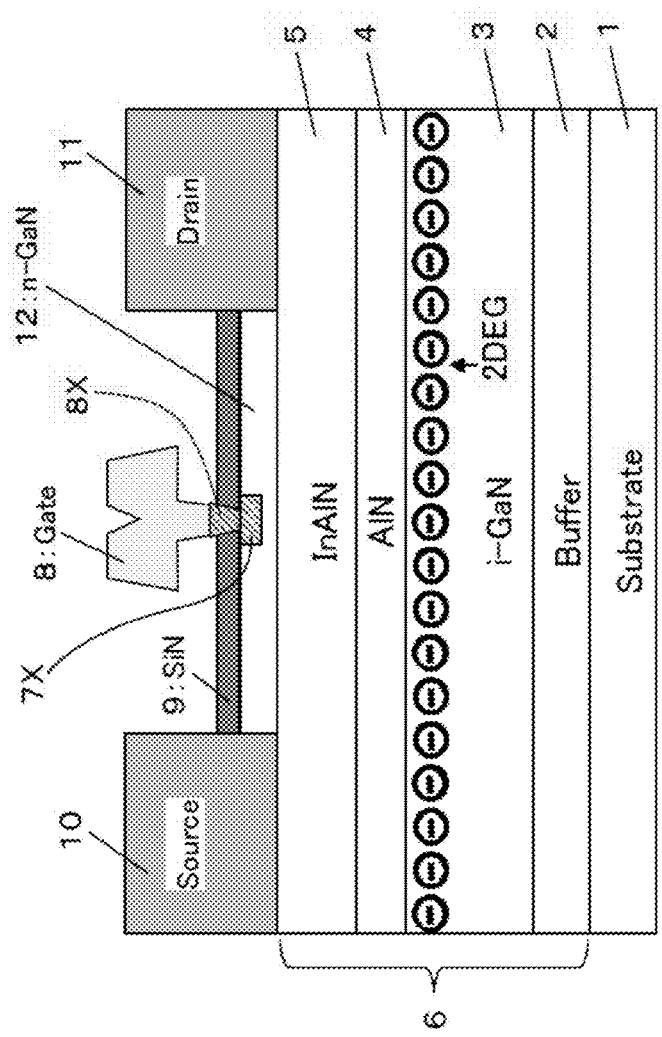

Further, for example, as depicted in FIG. 10, in the MOS type semiconductor device (InAlN/GaN-HEMT) that includes the gate electrode 8 contacting with an oxide layer (insulating layer) 7X obtained by oxidizing part of the cap layer 12 included in the semiconductor stacked structure 6, the portion 8X of the gate electrode 8 contacting with the oxide layer (insulating layer) 7X may be configured from an oxide of the metal configuring the portion of the gate electrode 8 contacting with the oxide layer (insulating layer) 7X. Consequently, it is possible to sufficiently reduce the gate leak current with certainty and suppress diffusing of the metal (for example, Ni) configuring the gate electrode 8 to the cap layer 12 or the InAlN electron supply layer 5. Further, it is possible to suppress an interfacial reaction and also suppress increase of the on-resistance.

Further, the present technology can be applied also to a metal insulator semiconductor (MIS) type semiconductor device (InAlN/GaN-HEMT) including a gate insulating layer (for example, SiO layer, AlO layer, HfO layer, SiN layer, AlN layer or the like) formed, for example, from an oxide. It is to be noted that it is preferable to configure the gate insulating layer formed from an oxide so as to be formed from a high dielectric constant material such as, for example, aluminum oxide.

Figure 11:
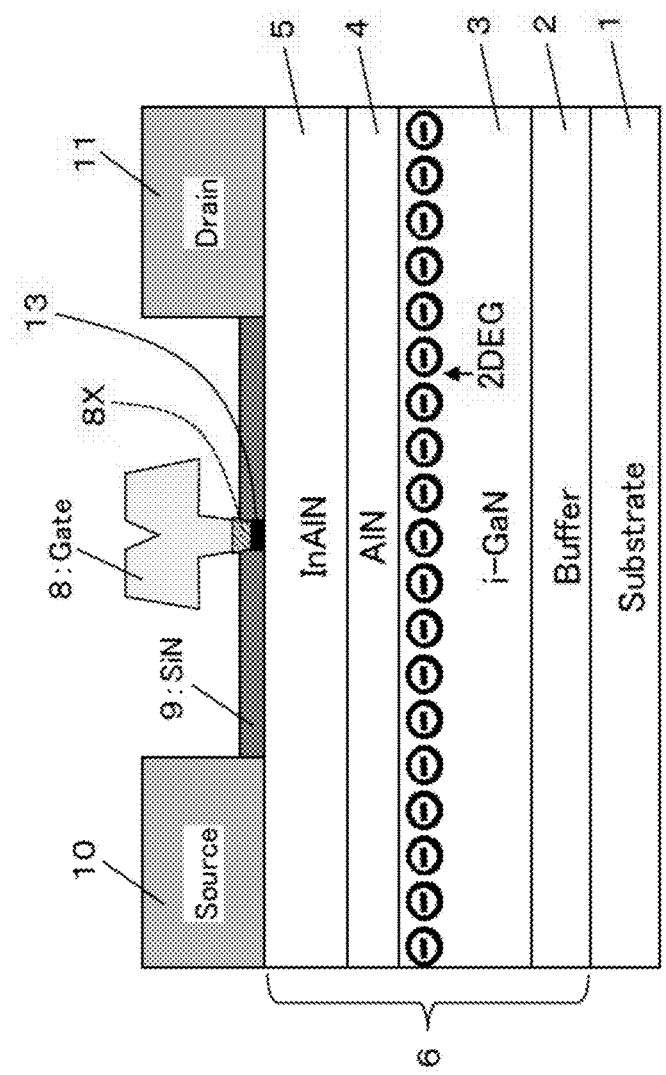

In particular, for example, as depicted in FIG. 11, in an MIS type semiconductor device (InAlN/GaN-HEMT) including a gate insulating layer 13 formed from an oxide, a portion 8X of the gate electrode 8 contacting with the gate insulating layer (insulating layer) 13 may be configured from an oxide of the metal configuring the portion of the gate electrode 8 contacting with the gate insulating layer (insulating layer) 13. Consequently, it is possible to sufficiently reduce the gate leak current with certainty and suppress diffusing of the metal (for example, Ni) configuring the gate electrode 8 to the gate insulating layer 13 or the InAlN electron supply layer 5. Also it is possible to suppress an interfacial reaction and suppress increase of the on-resistance.

Figure 12:
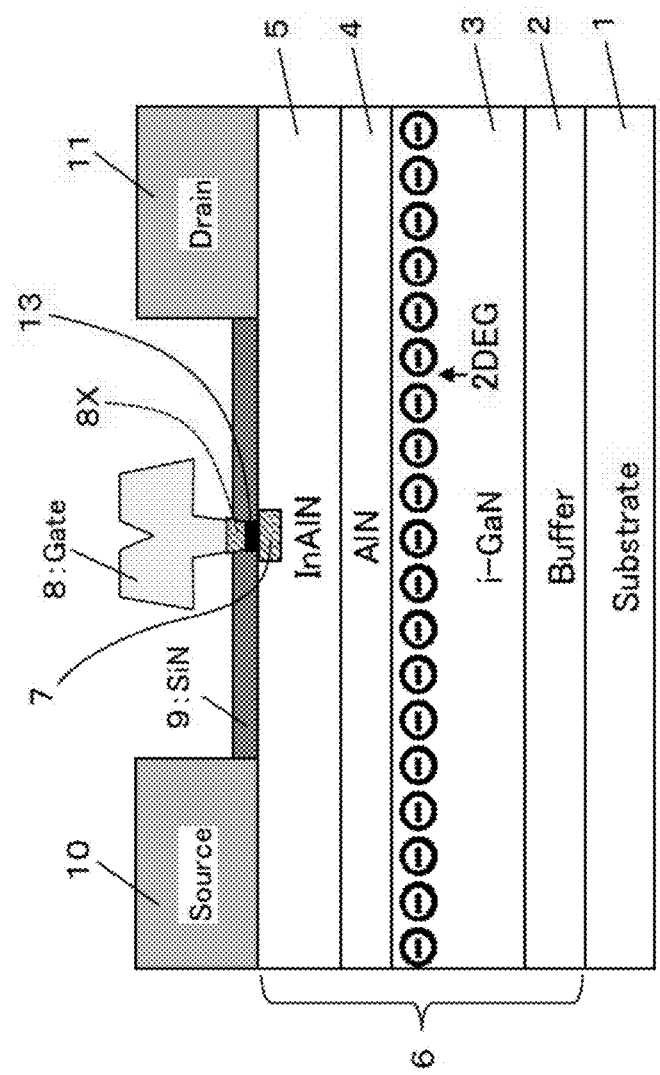

Further, for example, as depicted in FIG. 12, in the semiconductor device (InAlN/GaN-HEMT) that includes an oxide layer 7 obtained by oxidizing part of the electron supply layer 5 included in the semiconductor stacked structure 6 and the gate insulating layer 13 formed from an oxide, the portion 8X of the gate electrode 8 contacting with the gate insulating layer (insulating layer) 13 may be configured from an oxide of the metal configuring the portion of the gate electrode 8 contacting with the gate insulating layer (insulating layer) 13. Consequently, it is possible to sufficiently reduce the gate leak current with certainty and suppress diffusing of the metal (for example, Ni) configuring the gate electrode 8 to the gate insulating layer 13 or the InAlN electron supply layer 5. Also it is possible to suppress an interfacial reaction and further suppress increase of the on-resistance.

Figure 13:
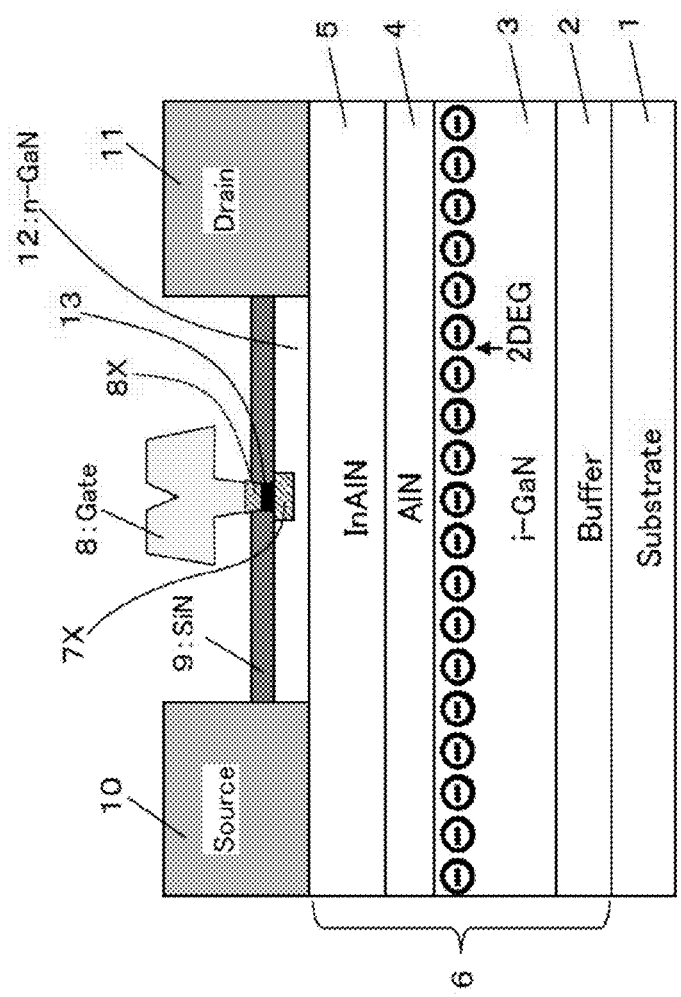

Further, for example, as depicted in FIG. 13, in the semiconductor device (InAlN/GaN-HEMT) that includes an oxide layer 7X obtained by oxidizing part of the electron cap layer 12 included in the semiconductor stacked structure 6 and the gate insulating layer 13 formed from an oxide, the portion 8X of the gate electrode 8 contacting with the gate insulating layer (insulating layer) 13 may be configured from an oxide of the metal configuring the portion of the gate electrode 8 contacting with the gate insulating layer (insulating layer) 13. Consequently, it is possible to sufficiently reduce the gate leak current with certainty and suppress diffusing of the metal (for example, Ni) configuring the gate electrode 8 to the gate insulating layer 13 or the cap layer 12. Also it is possible to suppress an interfacial reaction and further suppress increase of the on-resistance.

Further, for example, the present technology can be applied also to a semiconductor device that has a semiconductor stacked structure including a semiconductor layer containing In (for example, InP layer or the like) as a semiconductor layer. For example, such a configuration as described just below may be applied. In particular, in the semiconductor device that includes a semiconductor stacked structure including a semiconductor layer containing In as a semiconductor layer and in which a gate electrode contacts with a semiconductor layer containing In, a portion of the gate electrode contacting with the semiconductor layer containing In (semiconductor layer) is configured from an oxide of the metal configuring the portion of the gate electrode contacting with the semiconductor layer containing In (semiconductor layer). Consequently, it is possible to reduce the gate leak current and suppress diffusing of the metal (for example, Ni) configuring the gate electrode to the semiconductor layer containing In. Also it is possible to suppress an interfacial reaction and further suppress increase of the on-resistance.

Further, while the embodiment described above is described taking, as an example, an InAlN/GaN-HEMT in which GaN and InAlN are used for the electron transit layer and the electron supply layer, respectively, as the semiconductor device, the semiconductor device is not limited to this. For example, the present technology can be applied also to an AlGaN/GaN-HEMT in which GaN and AlGaN are used for an electron transit layer and an electron supply layer, respectively, or an InAlGaN/GaN-HEMT in which GaN and InAlGaN are used for an electron transit layer and an electron supply layer, respectively. In this manner, the present technology can be applied to a semiconductor device that includes an electron supply layer containing all or part of the elements of In, Al, Ga and N. Consequently, the gate leak current can be reduced. Further, the semiconductor stacked structure may be a structure in which a semiconductor layer including at least an electron supply layer and an electron transit layer is stacked, and the present technology can be applied also to a semiconductor device having a different nitride semiconductor stacked structure. Consequently, the gate leak current can be reduced.

Second Embodiment

Now, a power supply apparatus according to a second embodiment is described with reference to FIG. 14.

The power supply apparatus according to the present embodiment is a power supply apparatus that includes any one of the semiconductor devices (HEMTs) according to the first embodiment and modifications to the first embodiment described above.

Figure 14:
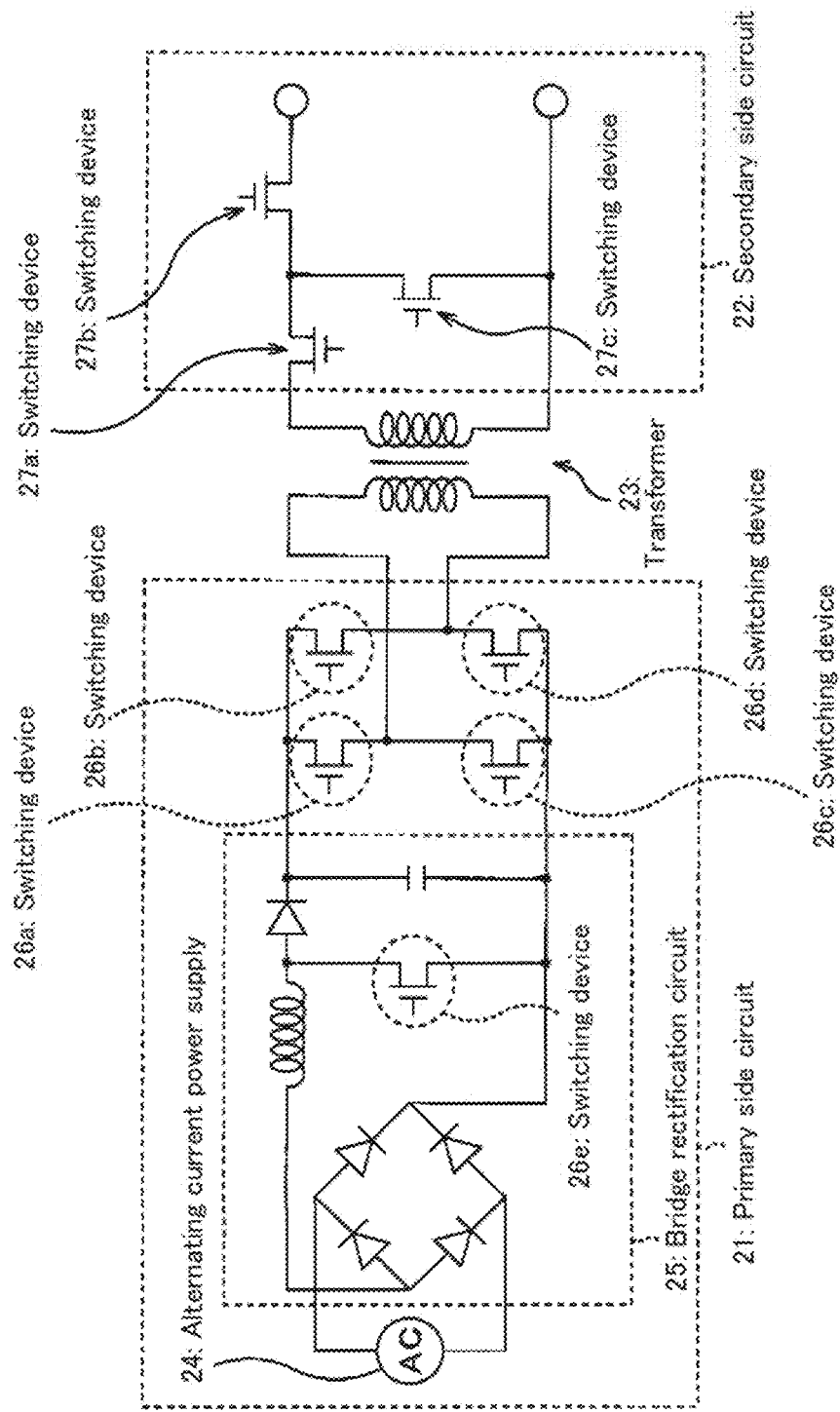
FIG. 14 is a schematic view depicting a configuration of a power supply apparatus according to a second embodiment.

As depicted in FIG. 14, the present power supply apparatus includes a high-voltage primary side circuit (high voltage circuit) 21 and a low-voltage secondary side circuit (low voltage circuit) 22, and a transformer 23 disposed between the primary side circuit 21 and the secondary side circuit 22.

The primary side circuit 21 includes an alternating current power supply 24, a bridge rectification circuit 25 and a plurality of (here, four) switching devices 26a, 26b, 26c and 26d. Further, the bridge rectification circuit 25 has a switching device 26e.

The secondary side circuit 22 includes a plurality of (here, three) switching devices 27a, 27b and 27c.

In the present embodiment, the switching devices 26a, 26b, 26c, 26d and 26e of the primary side circuit 21 are configured from any one of the HEMTs according to the first embodiment and modifications. On the other hand, the switching devices 27a, 27b and 27c of the secondary side circuit 22 are configured from a normal MIS-FET for which silicon is used.

Accordingly, with the power supply apparatus according to the present embodiment, since the semiconductor device (HEMT) according to any one of the first embodiment and modifications described above is applied to the high voltage circuit 21, there is an advantage that a power supply apparatus having high reliability can be implemented.

Third Embodiment

Now, a high-frequency amplifier according to a third embodiment is described with reference to FIG. 15.

The high-frequency amplifier according to the present embodiment is a high-frequency amplifier including any one of the semiconductor devices (HEMTs) according to the first embodiment and modifications described above.

Figure 15:
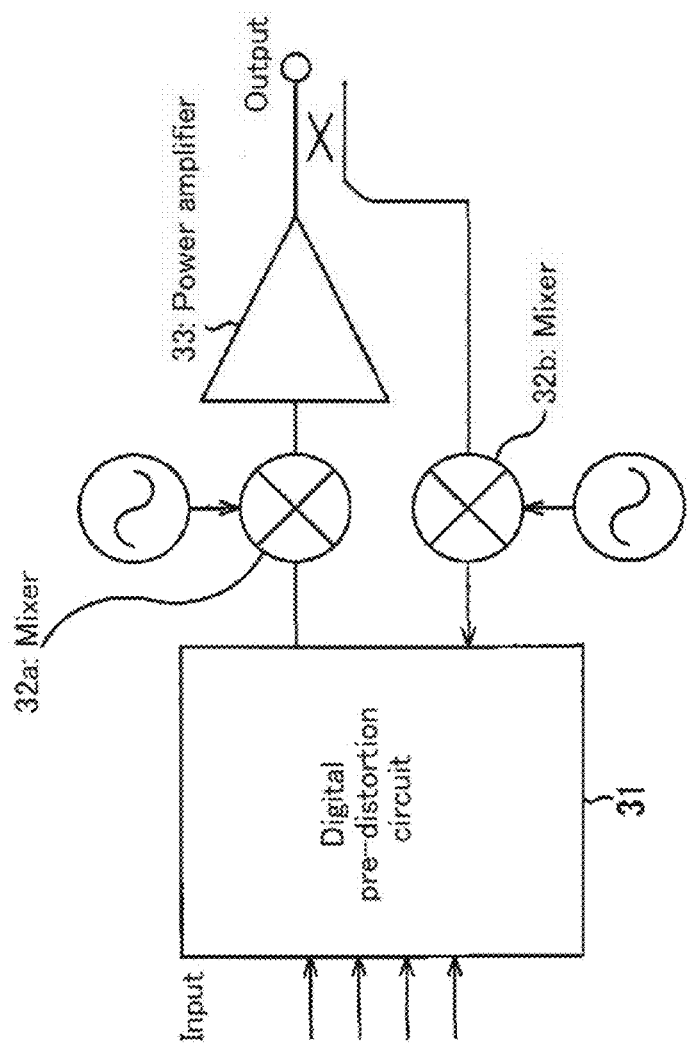
FIG. 15 is a schematic view depicting a configuration of a high-frequency amplifier according to a third embodiment.

As depicted in FIG. 15, the present high-frequency amplifier includes a digital pre-distortion circuit 31, mixers 32a and 32b and a power amplifier 33. It is to be noted that the power amplifier is sometimes referred to simply as amplifier.

The digital pre-distortion circuit 31 compensates for non-linear distortion of an input signal.

The mixers 32a and 32b mix the input signal whose non-linear distortion is compensated for and an alternating current signal.

The power amplifier 33 amplifies the input signal mixed with the alternating current signal and includes any one of the HEMTs according to the first embodiment and modifications described above.

It is to be noted that FIG. 15 depicts a configuration in which, for example, by changeover of a switch, a signal at the output side can be mixed with an alternating current signal by the mixer 32b and sent out to the digital pre-distortion circuit 31.

Accordingly, with the high-frequency amplifier according to the present embodiment, since the semiconductor device (HEMT) according to any one of the first embodiment and modifications described above is applied to the power amplifier 33, there is an advantage that a high-frequency amplifier having high reliability can be implemented.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device, comprising:
   a semiconductor stacked structure in which a semiconductor layer including an electron supply layer and an electron transit layer is stacked; and
   a gate electrode contacting with an oxide layer configured by oxidizing part of the electron supply layer; wherein
   the portion of the gate electrode contacting with the oxide layer is an oxide of nickel configuring the portion of the gate electrode contacting with the oxide layer.

2. The semiconductor device according to claim 1, wherein the electron supply layer is an electron supply layer containing all or part of elements of In, Al, Ga and N.

3. The semiconductor device according to claim 2, wherein the electron supply layer is an InAlN electron supply layer.

4. The semiconductor device according to claim 1, wherein the electron supply layer is an InAlN electron supply layer;
   the oxide layer is an aluminum oxide layer configured by oxidizing part of the InAlN electron supply layer; and
   the gate electrode contacts with the aluminum oxide layer.

5. A power supply apparatus, comprising:
   a transformer; and
   a high-voltage circuit and a low-voltage circuit provided sandwiching the transformer therebetween; wherein
   the high-voltage circuit includes a transistor;
   the transistor includes:
      a semiconductor stacked structure in which a semiconductor layer including an electron supply layer and an electron transit layer is stacked; and
      a gate electrode contacting with an oxide layer configured by oxidizing part of the electron supply layer; wherein
      the portion of the gate electrode contacting with the oxide layer is an oxide of nickel configuring the portion of the gate electrode contacting with the oxide layer.

6. A high-frequency amplifier, comprising:
   an amplifier configured to amplify an input signal; wherein
   the amplifier includes a transistor; and
   the transistor includes:
      a semiconductor stacked structure in which a semiconductor layer including an electron supply layer and an electron transit layer is stacked; and
      a gate electrode contacting with an oxide layer configured by oxidizing part of the electron supply layer; wherein
      the portion of the gate electrode contacting with the oxide layer is an oxide of nickel configuring the portion of the gate electrode contacting with the oxide layer.

* * * * *